United States Patent [19]

Narimatsu et al.

[11] Patent Number: 4,928,438

[45] Date of Patent: May 29, 1990

[54] WAFER PROCESSING FILM

[75] Inventors: Osamu Narimatsu, Nagoya; Michiyasu Ito, Kuwana; Kazuyoshi Komatsu; Yasuhiro Shibata, both of Nagoya, all of Japan

[73] Assignee: Mitsui Toatsu Chemicals, Incorporated, Tokyo, Japan

[21] Appl. No.: 357,351

[22] Filed: May 26, 1988

Related U.S. Application Data

[62] Division of Ser. No. 823,492, filed as PCT JP85/00284 on May 23, 1985, published as WO85/05734 on Dec. 19, 1985, Pat. No. 4,853,286.

[30] Foreign Application Priority Data

Aug. 7, 1984 [JP] Japan .................................. 59-16438
May 29, 1987 [JP] Japan .................................. 59-107539

[51] Int. Cl.$^5$ ................................................ B24B 1/00
[52] U.S. Cl. ............................ 51/283 R; 51/DIG. 22; 51/DIG. 27
[58] Field of Search ................... 51/DIG. 22, 27, 293, 51/295, 323, 283; 428/343

[56] References Cited

U.S. PATENT DOCUMENTS

| | | | |
|---|---|---|---|
| 4,311,759 | 1/1982 | Glennon | 428/345 |
| 4,312,916 | 1/1982 | Kakumaru et al. | 428/345 |
| 4,395,451 | 6/1983 | Althouse | 428/343 |
| 4,756,968 | 7/1988 | Ebe et al. | 428/343 |

OTHER PUBLICATIONS

*Technical Update*, "B-Stage Epoxies" 3-86, Grace Co.

*Primary Examiner*—Edith Buffalow
*Attorney, Agent, or Firm*—Cushman, Darby and Cushman

[57] ABSTRACT

This invention provides a wafer processing film comprising a base film having a Shore D hardness of 40 or less and an adhesive layer disposed on one surface of the base film. In grinding the surfaces of wafers such as silicon and similar wafers, breakage can be prevented by affixing the wafers to the adhesive layer of the processing film and then grinding them.

5 Claims, No Drawings

WAFER PROCESSING FILM

This is a continuation division of Application Ser. No. 823,492, filed as PCT JP85/00284 on May 23, 1985, published as WO85/05734 on Dec. 19, 1985, now U.S. Pat. No. 4,853,286.

DESCRIPTION

1. Technical Field

This invention relates to a film which is used in the grinding of wafers such as silicon and other wafers so as to prevent their breakage.

2. Background Art

Wafers for use in the fabrication of semiconductor chips include silicon wafers, gallium arsenide wafers and similar wafers. Among others, silicon wafers are being widely used. For example, silicon wafers are produced by cutting a high-purity single-crystal silicon ingot into slices having a thickness of the order of 500 to 1000 μm. In recent years, these wafers are tending to become thinner as the size of chips is reduced and the production scale of chips is enlarged. Moreover, the diameter of these wafers is passing from the conventional value of 3-4 inches to 5-8 inches.

Silicon wafers are inherently fragile. In addition, silicon wafers having integrated circuits formed in their surface are easily broken, even under the action of slight external forces, because of their surface roughness. This disadvantage constitutes a serious obstacle to post-processing operations such as back surface grinding.

As a method for preventing silicon wafers from being broken during surface grinding there has conventionally been employed the method in which, prior to surface grinding, silicon wafers are coated with paraffin, resist ink or the like so as to compensate for their surface roughness and to distribute properly the external forces exerted thereon. However, this method involves the step of drying and solidifying paraffin or the like after its application to a wafer surface and the step of washing off the paraffin or the like from the ground wafer with a solvent under the application of heat, thus requiring complicated operation. In addition, this prior art method is still unable to prevent wafer breakage in the grinding of wafers having a diameter of 5 inches or greater, which has constituted a serious obstacle to the enhancement of productivity. Moreover, the use of paraffin or the like involves the problem of contamination of wafer surfaces. Accordingly, it has been strongly desired to develop a method for the prevention of wafer breakage which can replace the application of paraffin or the like.

As a method for the prevention of wafer breakage which can replace the application of paraffin or the like, one in which a processing film having an adhesive layer is affixed to a wafer surface has been investigated. However, this method has been unable to prevent wafer breakage perfectly. Moreover, it has been found that, where such a processing film is used, airborne dust may adhere to the adhesive layer during the manufacture, transport or storage of the film. If this dust is transferred and attached to the wafer surface, deterioration of the semiconductor due to wafer corrosion or the like and, further, malfunction or other problems may result. In other words, where such a processing film is used, the dust attached to the wafer surface cannot be satisfactorily removed simply by cleaning the processed wafer in the conventional manner. Because of these problems, no practical method for preventing wafer breakage by use of a processing film has been developed as yet.

DISCLOSURE OF THE INVENTION

In view of the above-described problems, the present inventors conducted research concerning the method of preventing the breakage of wafers being processed and have found that the breakage of wafers can be prevented by affixing a processing film having a specific hardness to a wafer surface with an adhesive layer interposed therebetween, so as to compensate for the roughness of the wafer surface and to distribute properly the external forces exerted thereon during processing. They have also found that, by laminating an auxiliary film having a specific hardness to the opposite surface of this processing film to that having an adhesive layer disposed thereon, its workability in affixing the processing film to a wafer and separating it from the processed wafer can be greatly improved without impairing its effect of preventing wafer breakage. Furthermore, they have found that the above-described removal of dust can be easily achieved by properly choosing the composition of the adhesive substance constituting the adhesive layer. The present invention has been completed on the basis of these findings.

It is an object of the present invention to provide a wafer processing film which, when used in the surface grinding of wafers and, in particular, of silicon wafers, can prevent their breakage perfectly.

It is another object of the present invention to provide a wafer processing film which is easy to handle and which can improve productivity in wafer processing operations including cleaning operation.

According to the present invention, there is provided a wafer processing film comprising a base film having a Shore D hardness of 40 or less and an adhesive layer disposed on one surface of the base film.

Moreover, it is preferable that an supporting film having a Shore D hardness greater than 40 be laminated to the surface of the base film having no adhesive layer disposed thereon.

Furthermore, it is also preferable that the adhesive layer contains one or more members selected from the group consisting of nonionic surface active agents and ethylene glycol derivatives.

BEST MODE FOR CARRYING OUT THE INVENTION

The wafers to which the wafer processing film of the present invention is directed include not only silicon wafers but also such other wafers as gallium arsenide, gallium phosphide and germanium. It is especially useful in the processing of silicon wafers of large diameter.

The wafer processing film of the present invention is used in such a way that a wafer to be subjected to surface grinding is affixed to the adhesive layer of this processing film and its surface is then ground. By using this processing film in the above-described way, the wafer can be prevented from being broken during surface grinding. Moreover, after completion of the processing, contamination of the wafer surface can be prevented by separating the wafer from the processing film and then subjecting it to a simple cleaning procedure.

The base film used in the wafer processing film of the present invention may be selected from various films consisting of such materials as thermoplastic resins, thermosetting resins, natural rubber and synthetic rubbers, provided that they have a Shore D hardness of 40 or less and preferably 30 or less. As used herein, Shore D hardness means a value obtained by measurement with a Shore hardness tester of the D type according to ASTM D-2240. Films having a Shore D hardness greater than 40 lack the ability to distribute properly the external forces exerted on the wafer and cannot substantially prevent the breakage of wafers being ground.

Typical examples of the material constituting the base film include thermoplastic elastomers such as ethylene-vinyl acetate copolymers, polybutadiene, polyurethenes, non-rigid polyvinyl chloride resin, polyolefins, polyesters, polyamides, etc.; synthetic rubbers such as diene rubber, nitrile rubber, silicone rubber, acrylic rubber, etc.; and the like. The thickness of the base film may suitably be determined according to the shape and surface condition of silicon wafers to be protected, the grinding method, and grinding conditions. However, it should usually be of the order of 10 to 2000 $\mu$m.

The wafer processing film of the present invention may comprise a two-layer structure composed of a base film and an adhesive layer. However, since the base film is highly flexile, the processing film is rather poor in workability when it is affixed to a wafer and separated from the ground wafer. Accordingly, in order to improve its workability without impairing the ability of the base film to prevent wafer breakage, it is preferable to laminate a supporting film having a Shore D hardness greater than 40 to the surface of the base film having no adhesive layer disposed thereon.

This supporting film may suitably be selected from various films made of such materials as thermoplastic resins, thermosetting resins, paper or wooden sheet laminated with a synthetic resin, and the like, provided that they have a Shore D hardness greater than 40. Films having a Shore D hardness of 40 or cannot improve workability in affixing and separating the wafer processing film.

Typical examples of the material constituting the supporting film include synthetic resins such as polyethylene, polypropylene, polyesters, polyamides, rigid polyvinyl chloride resin, polyether sulfones, acrylic resins, phenolic resins, etc.; paper impregnated with a phenolic resin; polyethylene-coated paper; and the like.

The thickness of the supporting film may suitably be determined depending on the machines for affixing the processing film to a wafer and removing it from the wafer, and the thickness of the base film. However, it should usually be of the order of 10 to 1000 $\mu$m.

The supporting film may be laminated to the base film according to any of various conventionally known processes. For example, these processes include:
(1) the process in which a base film and an supporting film are prepared in advance, an adhesive is applied to one of them, and the film are superposed and adhered together;
(2) the process in which two films are simultaneously extruded and adhered by two-layer T-die extrusion or two-layer inflation;
(3) the process in which a film is prepared in advance and another resin is laminated thereto by T-die extrusion or calendering; and the like.

As the adhesive substance constituting the adhesive layer disposed on one surface of the base film, there may be used any of commercially available, common adhesives such as acrylic adhesives, ester adhesives, urethane adhesives and synthetic rubber adhesives. However, it is preferable to use an adhesive containing a nonionic surface active agent. Moreover, it is preferable to form the adhesive layer by adding an ethylene glycol derivative to an aqueous emulsion of an adhesive and applying this mixture to one surface of the base film. Where the adhesive layer has this composition, any dust which may be transferred from the adhesive.substance or adhesive layer to the wafer surface can be relatively easily washed off and, moreover, the wafer surface can be protected against corrosion.

Suitable nonionic surface active agents include, for example, polyoxyethylene octyl phenyl ether, alkanol amides, polyoxyethylene nonyl phenyl ether, polyethylene glycol and polyoxyethylene lauryl ether. Anionic and cationic surface active agents are not preferable because they tend to corrode the wafer surface. The content of the nonionic surface active agent should suitably be from 0.01 to 50 parts by weight and more preferably from 0.1 to 10 parts by weight, per 100 parts by weight of the adhesive substance.

Suitable ethylene glycol derivatives include, for example, diethylene glycol monobutyl ether, triethylene glycol monomethyl ether, ethylene glycol monomethyl ether and diethylene glycol monobutyl ether acetate. The ethylene glycol derivatives should preferably have a boiling point of 100° C. or above and more preferably 150° C. or above. Ethylene glycol derivatives having a boiling point lower than 100° C. barely contribute to the improvement of dust removal by wafer cleaning, because they tend to evaporate during application of the adhesive substance and barely remain in the adhesive layer. The amount of ethylene glycol derivative used may suitably be determined in consideration of the adhesion of the adhesive substance to wafers and its effect on dust removal from the separated wafer. However, it should usually be from 1 to 100 parts by weight and more preferably from 5 to 50 parts by weight, per 100 parts by weight of the aqueous emulsion adhesive (having a solids content of 30 to 60% by weight) used for the formation of the adhesive layer.

The thickness of the adhesive layer may suitably be determined depending on, for example, the surface condition and shape of silicon wafers to be processed and the grinding method. However, it should usually be of the order of 2 to 200 $\mu$m.

As the method of applying the adhesive substance to one surface of the base film, there may be employed any of various conventionally known coating processes such as roll coating, gravure coating, bar coating, dip coating, brushing and spray coating. The adhesive substance may be applied to the whole surface or to selected surface areas of the base film.

Since the wafer processing film of the present invention is characterized in that the base film has the property of absorbing the external forces exerted on wafers and of distributing them properly, the breakage of wafers being processed can be prevented by affixing the wafers to the wafer processing film and then grinding their surfaces. Where the wafer processing film has a supporting film laminated thereto, it is excellent in shape retention properties and exhibits very good workability in affixing the wafer processing film to a wafer and separating it from the ground wafer, thus making it possible to produce a marked effect in the improvement of productivity. Furthermore, where the adhesive layer has a preferred composition as defined above, the wafer processing film has the great advantages that after-treatment such as cleaning of the wafer separated from the wafer processing film can be easily carried out and contamination or corrosion of the wafer surface can be avoided.

The present invention is further illustrated by the following examples.

EXAMPLE 1

One surface of an ethylene-vinyl acetate copolymer resin film (200 μm thick) having a Shore D hardness of 30 as measured according to ASTM D-2240 was subjected to a corona discharge treatment, coated with the acrylic adhesive "Aromatex" (trademark; manufactured by Mitsui-Toatsu Chemicals Co., Ltd.) by means of a roll coater, and then dried at 90° C. to form a silicon wafer processing film having disposed thereon an acrylic adhesive layer of about 50 μm thickness.

Using an automatic affixing machine (manufactured by Disco, Ltd.), a piece of this film was affixed to the front surface of a silicon wafer (6 inches) having integrated circuits formed therein and exhibiting a surface roughness of about 50 μm, and the back surface of the wafer was ground by means of a grinding machine (manufactured by Disco, Ltd.). After grinding, the wafer was separated from the film and then washed with deionized water. In this manner, a total of 100 wafers having a ground back surface were produced. During this process, none of the wafers were broken and the overall working time was about 1 hour.

EXAMPLE 2

The same ethylene-vinyl acetate copolymer resin film as used in Example 1 was laminated to a polypropylene film (100 μm thick) having a Shore D hardness of 80, by means of the acrylic adhesive "Bonron" (trademark; manufactured by Mitsui-Toatsu Chemicals Co., Ltd.). Then, a wafer processing film was formed by disposing the same adhesive layer as used in Example 1 on the copolymer resin surface of the resulting film in the same manner as described in Example 1.

Using this film, a total of 100 silicon wafers Were ground in the same manner as described in Example 1. During this process, none of the wafers were broken and the overall working time was about 30 minutes.

EXAMPLE 3

A silicon wafer processing film was formed in the same manner as described in Example 1, except that a butadiene rubber sheet (300 μm thick) having a Shore D hardness of 20 was used.

Using this film, a total of 100 silicon wafers were ground in the same manner as described in Example 1. During this process, none of the wafers were broken and the overall working time was about 1 hour.

EXAMPLE 4

According to the two-layer T-die extrusion method, butadiene rubber having a Shore D hardness of 20 and polypropylene having a Shore D hardness of 80 were simultaneously extruded to form a two-layer film (comprising a butadiene rubber layer of 200 μm thickness and a polypropylene layer of 200 μm thickness). Then, a wafer processing film was formed by applying an acrylic adhesive layer of about 30 μm thickness to the butadiene rubber surface of the above film in the same manner as described in Example 1. This film was used by affixing a piece thereof to the surface of a silicon wafer exhibiting a surface roughness of about 30 μm. Thus, a total of 100 ground silicon wafers were produced in the same manner as described in Example 1. As a result of grinding, none of the wafers were rejected because of breakage and the entire processing work was completed in about 30 minutes.

COMPARATIVE EXAMPLE 1

On the front surface of a silicon wafer of the same type as used in Example 1, the polyisoprene resist ink JSR CIR (trademark; manufactured by Nippon Synthetic Rubber Co., Ltd.) was cast at about 50° C. and cooled for 2 hours. Thereafter, the back surface of the wafer was ground. Then, the wafer was washed with trichloroethylene heated at 50° C. to remove the resist ink, and then rinsed in deionized water. In this manner, a total of 100 processed silicon wafers were produced. During this process, 20 wafers were broken and the time required to complete the entire processing work was about 5 hours. Thus, when compared with Example 2, the production rate was about 1/10 and the product yield was 80%. Furthermore, the washed wafer surfaces showed evidence of contamination with the resist ink.

COMPARATIVE EXAMPLE 2

A low-density polyethylene film (200 μm thick) having a Shore D hardness of 50 and a polypropylene film (100 μm thick) having a Shore D hardness of 80 were laminated in the same manner as described in Example 2. Then, a wafer processing film was prepared by applying an acrylic adhesive layer of about 30 um thickness to the low-density polyethylene surface of the resulting film in the same manner as described in Example 1.

Using this film, the back surfaces of 100 silicon wafers were ground in the same manner as described in Example 4. As a result, 76 wafers were rejected because of breakage.

EXAMPLE 5

Into a flask fitted with a thermometer, a reflux condenser, a dropping funnel, a nitrogen inlet and a stirrer were charged 115 parts by weight of deionized water and 2 parts by weight of polyoxyethylene nonyl phenyl ether. After the contents were heated to 70° C. with stirring under an atmosphere of nitrogen, 0.5 part by weight of the azo polymerization initiator "ACVA" (trademark; manufactured by Otsuka Pharmaceutical Co., Ltd.) was added thereto and dissolved therein. Then, a monomer mixture consisting of 23 parts by weight of methyl methacrylate, 73 parts by weight of 2-ethylhexyl acrylate, 2 parts by weight of glycidyl methacrylate and 2 parts by weight of methacrylic acid was continuously added dropwise thereto over a period of 4 hours. After completion of the addition, the stirring was continued for an additional 3 hours to effect polymerization. Thus, there was obtained an acrylic emulsion adhesive having a solid content of about 47% by weight.

Using this adhesive, a coating fluid having the following composition was prepared.

Acrylic emulsion adhesive —100 parts by weight
Diethylene glycol monobutyl —50 parts by weight ether
Polyoxyethyene phenyl ether —5 parts by weight A wafer processing film was formed in the same manner as described in Example 1, except that the above coating fluid was used.

A piece of the processing film so formed was affixed to a 4-inch silicon wafer and separated therefrom. The wafer was immersed in isopropyl alcohol at 50° C. and cleaned by exposure to ultrasonic waves for 10 minutes, then immersed in deionized water at ambient temperature and cleaned by exposure to ultrasonic waves for 10 minutes, and finally dried with an infrared heater. The amount of dust attached to the silicon wafer so cleaned was evaluated by means of a PC-320/LAS 346 tester (manufactured by HICA-ROYCO, Inc.). The results thus obtained are shown in Table 1. As can be seen from this table, only a very small amount of dust was attached to the wafer, indicating that the wafer could be cleaned satisfactorily.

EXAMPLE 6

One surface of a non-rigid polyvinyl chloride film (70 μm thick) formed by calendering and having a Shore D hardness of 35 was coated with a coating fluid having the following composition was prepared from the above acrylic emulsion adhesive synthesized in Example 5, which was applied by means of a roll coater and then dried at 90° C. to form a silicon wafer processing film having an adhesive layer of 10 μm thickness.
Acrylic emulsion adhesive —100 parts by weight
Triethylene glycol monomethyl —50 parts by weight ether
Polyoxyethylene lauryl ether —2 parts by weight Using this processing film, the amount of dust attached to the cleaned wafer was evaluated in the same manner as described in Example 5. The results thus obtained are also shown in Table 1.

EXAMPLE 7

Using a coating fluid prepared by adding 50 parts by weight of diethylene glcol monobutyl ether to 100 parts by weight of the acrylic emulsion adhesive synthesized in Example 5, a silicon wafer processing film was formed in the same manner as described in Example 1, except that the thickness of the adhesive layer was 10 μm.

Using this processing film, the amount of dust attached to the cleaned wafer was evaluated in the same manner as described in Example 5. The results thus obtained are also shown in Table 1.

REFERENCE EXAMPLE

The same monomer composition as used for the preparation of acrylic adhesive in Example 5 was subjected to solution polymerization and the resulting product was dissolved in acetone to prepare an adhesive solution (having a solid content of 50% by weight). Using a roll coater, this adhesive solution was applied to one surface of the same non-rigid polyvinyl chloride film as used in Example 6 and then dried at 90° C. to form a silicon wafer processing film having an adhesive layer of 10 μm thickness.

Using this processing film, the amount of dust attached to the washed wafer was evaluated in the same manner as described in Example 5. The results thus obtained are also shown in Table 1. In this case, a very large amount of dust was attached to the wafer, indicating that the cleaning procedure used in the other examples failed to clean the wafer satisfactorily.

TABLE 1

| | Amount of dust attached to the wafer (number of particles) | | | | | |
|---|---|---|---|---|---|---|
| | 0.5 μm or less | 0.5-2 μm | 2-20 μm | 20-50 μm | 50-100 μm | 100 μm or greater |
| Example 5 | 50 | 30 | 10 | 0 | 0 | 0 |
| Example 6 | 80 | 60 | 20 | 0 | 0 | 0 |
| Example 7 | 100 | 80 | 50 | 0 | 0 | 0 |
| Reference Example | 3500 | 2030 | 500 | 100 | 100 | 10 |

We claim:

1. A method of grinding the surface of a wafer comprising the following steps:
    affixing an adhesive layer disposed on one surface of a base film having a Shore D hardness of 40 or less, to a first surface of a wafer having first and second surfaces; and
    grinding said second surface of said wafer.

2. A method of grinding the surface of a wafer according to claim 1, wherein a supporting film having a Shore D hardness greater than 40 is laminated to the surface of said base film, said supporting film having no adhesive layer disposed thereon.

3. A method of grinding the surface of a wafer according to claim 1, wherein said adhesive layer contains an additive wherein said additive is selected from the group consisting of nonionic surface active agents and ethylene glycol derivatives.

4. A method of grinding the surface of a wafer according to claim 3, wherein said ethylene glycol derivatives have a boiling point of 100° C. or above.

5. A wafer processing film comprising a base film having a Shore D hardness of 40 or less and an adhesive layer disposed on one surface of said base film, said base film being selected from the group consisting of ethylene-vinyl acetate copolymer resin and butadiene rubber.

* * * * *

UNITED STATES PATENT AND TRADEMARK OFFICE
CERTIFICATE OF CORRECTION

PATENT NO. : 4,928,438

DATED : May 29, 1990

INVENTOR(S) : NARIMATSU et al.

It is certified that error appears in the above-identified patent and that said Letters Patent is hereby corrected as shown below:

Change "[22] Filed: May 26, 1988" to --[22] Filed: May 26, 1989--.

Signed and Sealed this

Twenty-fourth Day of December, 1991

Attest:

HARRY F. MANBECK, JR.

*Attesting Officer*  *Commissioner of Patents and Trademarks*